United States Patent [19]

Hunt et al.

[11] Patent Number: 5,042,668
[45] Date of Patent: Aug. 27, 1991

[54] METHOD AND APPARATUS FOR RANDOM ELECTRONIC COMPONENT TESTING

[75] Inventors: Ronald E. Hunt, Georgetown; Verlon E. Whitehead, Austin, both of Tex.

[73] Assignee: International Business Machines Corporation, Armonk, N.Y.

[21] Appl. No.: 411,179

[22] Filed: Sep. 22, 1989

[51] Int. Cl.$^5$ .............. B07C 5/02; B07C 5/344; G01R 31/26
[52] U.S. Cl. .............. 209/539; 209/548; 209/573; 324/158 F
[58] Field of Search .............. 209/539, 540, 541, 543, 209/571, 573, 574, 546, 548, 549; 29/593, 705, 740; 324/158 F

[56] References Cited

U.S. PATENT DOCUMENTS 3,384,236 5/1968 Best et al. .............. 209/541
3,716,134 2/1973 Campbell .............. 209/573 X

FOREIGN PATENT DOCUMENTS

1164036 6/1985 U.S.S.R. .............. 209/539

Primary Examiner—Michael S. Huppert
Assistant Examiner—Edward M. Wacyra
Attorney, Agent, or Firm—Andrew J. Dillon

[57] ABSTRACT

A method and apparatus are disclosed for randomly selecting and automatically testing surface mount passive electronic components. A detachable hopper is utilized to contain a plurality of randomly oriented electronic components which are agitated pneumatically and urged by vibration and gravity into a uniform orientation within a groove in an inclined track plate. A seal plate acts in conjunction with the groove within the track plate to form an elongate throat passage which is periodically cleared to prevent clogging by pulsating pneumatic pressure. A component detection circuit is utilized to detect the presence of an electronic component at a predetermined testing position and a pair of movable conductive probes are then urged into contact with the component to permit testing. In response to a successful test the component under test is then ejected pneumatically back into the detachable hopper. In the discussed embodiment of the present invention, an unsuccessful test will require the unsatisfactory component to be manually removed from the testing position by the operator of the apparatus.

16 Claims, 6 Drawing Sheets

METHOD AND APPARATUS FOR RANDOM ELECTRONIC COMPONENT TESTING

BACKGROUND OF THE INVENTION

1. Technical Field

The present invention relates in general to the field of electronic component testing and in particular to methods and apparatus for automatically testing electronic components during an assembly process. Still more particularly, the present invention relates to a method and apparatus for randomly selecting electronic components from a plurality of components and automatically testing the selected components.

2. Background Art

Electronic component testing devices are well known in the prior art. Many different manufacturers produce various meters and/or testing devices which may be utilized to accurately and easily determine whether or not a particular electronic component is within design specifications. While these test devices are entirely satisfactory for most applications, increasingly complex modern electronic devices require an enormous number of electronic components which must be tested during assembly to achieve a high degree of quality assurance.

Currently, the state-of-the-art in electronic device assembly is toward automated devices which are capable of positioning electronic components rapidly, accurately and without human intervention. A large number of such devices are known which are capable of repeatedly positioning very small electronic components on substrates or circuit boards utilizing robotics techniques. An effort is currently being made to advance the state of this art by means of machines capable of placing a plurality of electronic components on a substrate or circuit board simultaneously. For example, Panasonic National provides a system entitled "Panasert Simultaneous Chip Component Placement Machine Model No. NM8270." Another proposed system for simultaneously placing large numbers of electronic components onto substrates or printed circuit boards utilizes plastic carrier tubes which are loaded with large numbers of electronic components. An example of this type of system is disclosed in U.S. Pat. Application Ser. No. 07/155,945, filed Feb. 18, 1988, now abandoned, and assigned to the assignee hereof.

In each application in which many electronic components are to be mounted to a substrate or printed circuit board it is necessary to provide a method and apparatus to test large numbers of the electronic components so that system quality may be maintained. Those skilled in the quality assurance art will appreciate that while it is generally only necessary to test a small percentage of the total number of electronic components to be utilized in order to achieve a high level of quality, these modern systems utilize such astronomical numbers of electronic components that even a small percentage of the components can amount to a very large number. Thus, it should be apparent that manually testing these devices is not an effective manner of maintaining system quality in view of the large numbers of components involved. Therefore, a need exits for a method and apparatus which permits electronic components to be rapidly and randomly tested with a high degree of accuracy.

SUMMARY OF THE INVENTION

It is therefore one object of the present invention to provide an improved electronic component testing method and apparatus.

It is another object of the present invention to provide an improved electronic component testing method and apparatus for automatically testing large numbers of components during an electronic assembly process.

It is yet another object of the present invention to provide an improved electronic component testing method and apparatus for randomly selecting particular electronic components from a large number of components and automatically testing those components.

The foregoing objects are achieved as is now described. The method and apparatus of the present invention utilize a detachable hopper to contain a plurality of randomly oriented electronic components which are agitated pneumatically and urged by vibration and gravity into a uniform orientation within a groove in an inclined track plate. A seal plate acts in conjunction with the groove within the track plate to form an elongate throat passage which is periodically cleared to prevent clogging by pulsating pneumatic pressure. A component detection circuit is utilized to detect the presence of an electronic component at a predetermined testing position within the groove and a pair of movable conductive probes are then urged into contact with the component to permit testing. In response to a successful test the component under test is ejected pneumatically back into the detachable hopper. In the discussed embodiment of the present invention unsuccessful test will require the unsatisfactory component to be manually removed from a test jig by the apparatus operator.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
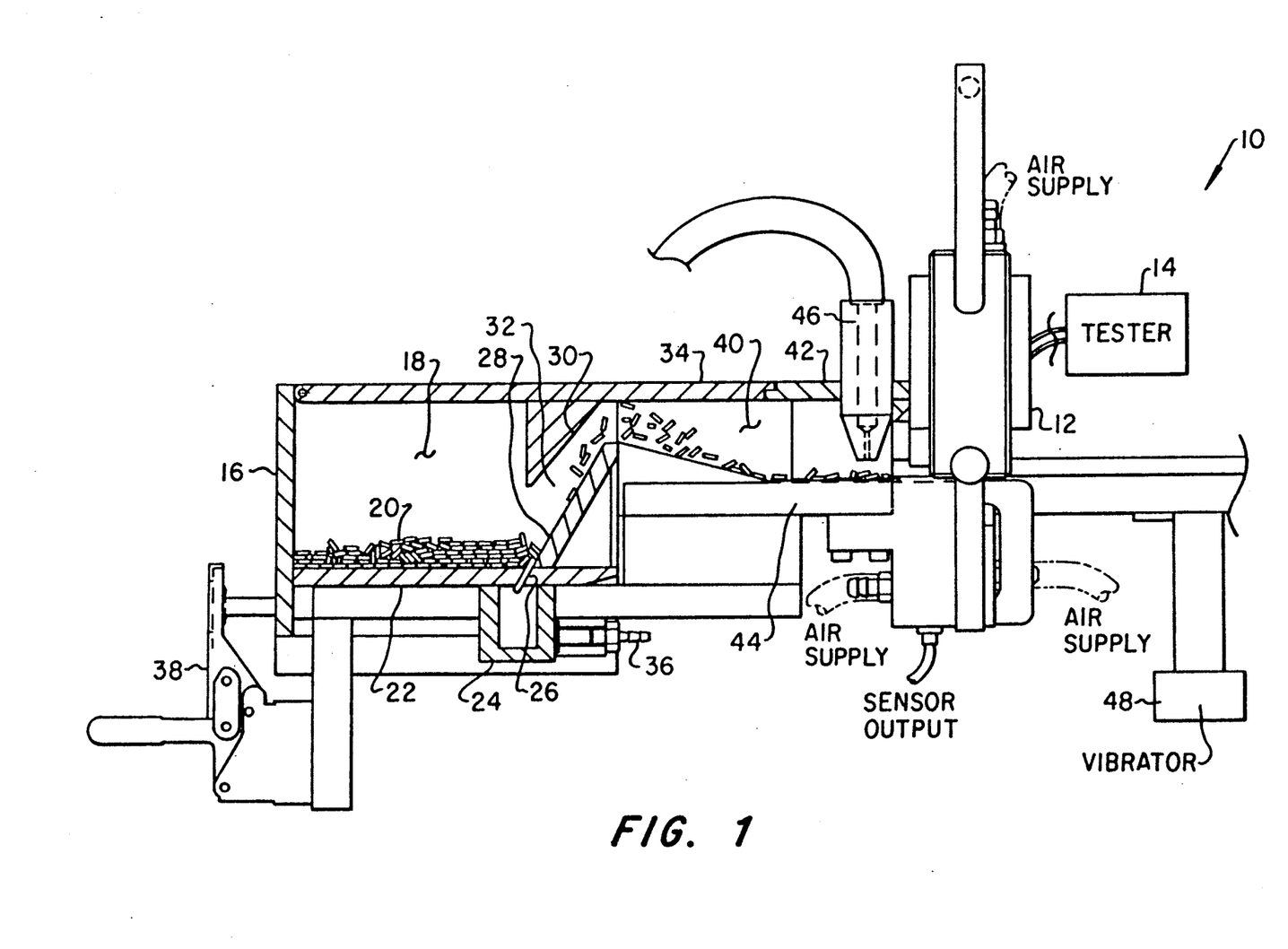
FIG. 1 depicts an elevational view of a portion of the electronic component testing system of the present invention, depicting chip movement from a hopper through a separator box to the track plate associated with an electronic component test jig.

With reference now to the figures, and in particular with reference to FIG. 1, there is depicted an elevational view of a portion of electronic component testing system 10 of the present invention. As may be seen, electronic component testing system 10 includes two major subassemblies. Namely, electronic component test jig 12, which will be illustrated in greater detail herein, and electronic component tester 14. Those skilled in the art will appreciate that electronic component tester 14 may be implemented utilizing any suitable electronic component testing device such as the Precision Component Analyzer Model No. 6425, manufactured by Wayne Kerr Company.

As is illustrated, electronic component testing system 10 is preferably utilized in conjunction with a chip handling system, such as the system disclosed within U.S. Pat. No. 4,974,390 and incorporated herein by reference thereto. Included within such a chip handling system is a detachable hopper 16, which includes a cavity 18, of sufficient size to serve as a reservoir for thousands of surface mount passive electronic components or chips 20, such as resistors or capacitors. Chips 20 may be added to cavity 18 by lifting or removing top plate 34 of hopper 16. Detachable hopper 16 is preferably held in place by means of a plurality of latches, such as latch 38, and may be removed in order to empty cavity 18.

As illustrated, a plurality of chips 20 are disposed within cavity 18, in random and a non-uniform orientation and therefore must be properly oriented in order to test or utilize these devices. As suggested in the referenced disclosure, it has been found that a combined means of vibratory action and agitation by pulsing air pressure may be utilized to effect a desired uniform orientation of chips 20 and that this action may be made more effective in terms of resultant throughput if an attempt is made to operate on less than the entire contents of cavity 18.

Accordingly, a mechanism is utilized to selectively control the number of chips 20 which are applied to electronic component test jig 12. This is accomplished by providing an air manifold 24, disposed beneath bottom plate 22 of cavity 18. Pressurized air is provided to air manifold 24 by means of nozzle assembly 36 and the resultant air pressure is then coupled into cavity 18 by means of a plurality of orifices, such as orifice 26. As is illustrated, orifice 26 is disposed within cavity 18 in a manner such that upon the activation of a pressurized air supply within manifold 24 a portion of chips 20 contained within cavity 18 will be urged upward through chamber 32, formed by plate 28 and deflector 30, and thence into chamber 40 of separator box 42.

Next, those chips 20 which are urged pneumatically into chamber 40 of separator box 42 will fall onto track plate 44. Vibrator 48 is then utilized in conjunction with the tilting of track plate 44 to cause chips 20 to be urged downward toward electronic component test jig 12 by both vibratory forces and gravity. As is illustrated, separator box 42 also serves to mount sensor 46, which may be implemented utilizing an optical sensor or other suitable means, sensor 46 is utilized for detecting the magnitude of chips which are present within separator box 42. Appropriate control circuitry, in response to an output signal from sensor 46, may then be utilized to cause periodic energization of the pneumatic supply lines coupled to nozzle assembly 36, when an insufficient number of chips 20 is detected by sensor 46 within separator box 42.

In this manner, a quantum of chips 20 may be caused to enter chamber 32 from cavity 18 in the hereinbefore described manner. In a typical operation of the apparatus described herein, it has been found that energization of the supply lines to nozzle assembly 36 at a rate of two pulses per second periodically is sufficient to enhance throughput operation of the chip handling system disclosed. Of course, these parameters may be adjusted as required for a particular application. For example, the angle at which track plate 44 is inclined will have a dramatic effect on the speed at which chips 20 will be processed by electronic component testing system 10.

After a chip has been properly oriented within a groove track plate 44 and then vibrated into electronic component test jig 12, the electronic component testing system 10 of the present invention will automatically and accurately cause that chip to be tested by means of electronic component tester 14. The features of electronic component test jig 12 will be described in greater detail herein.

Figure 2:
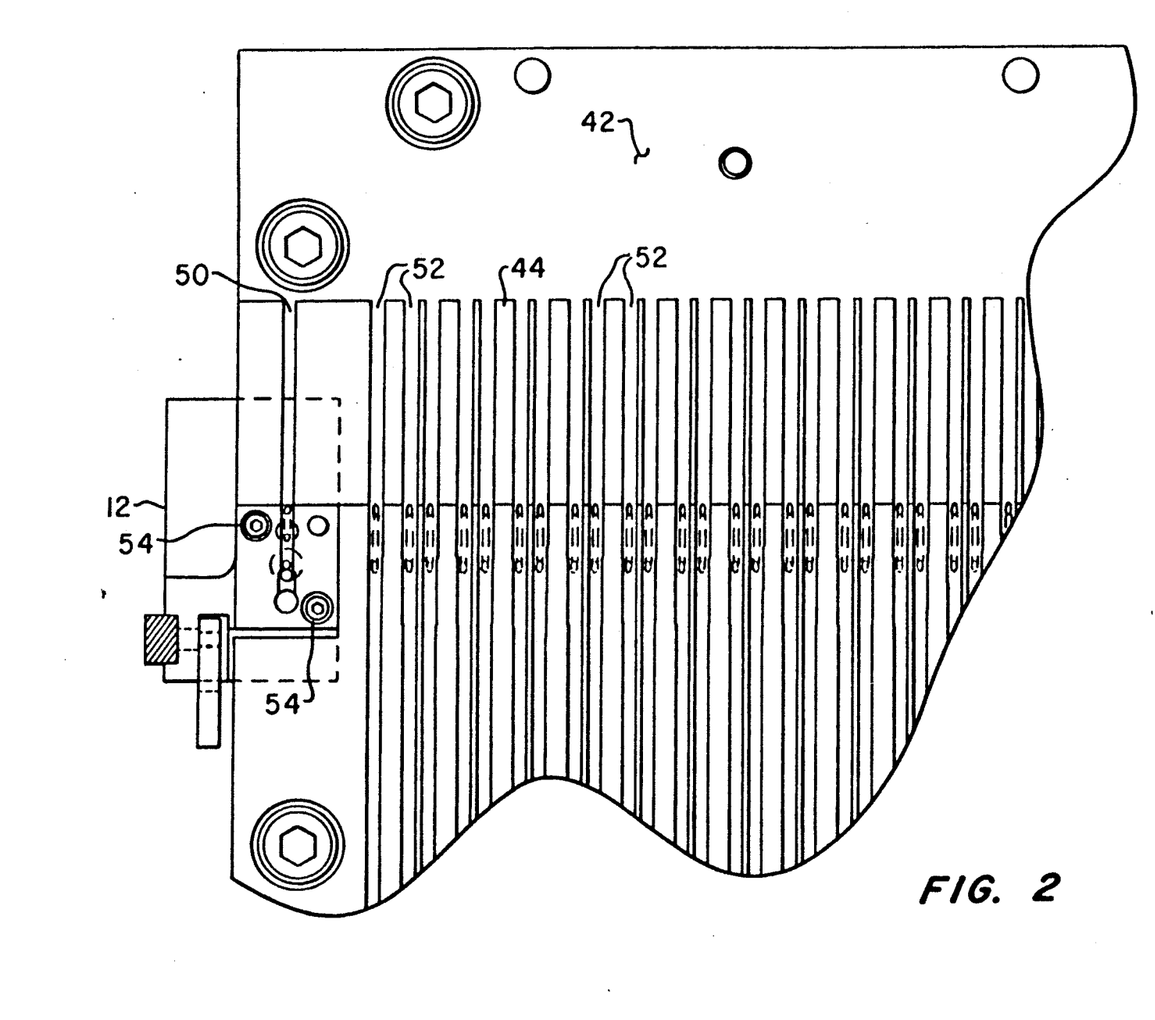
FIG. 2 depicts a partial top view of the track plate utilized with the electronic component test jig of the present invention.

Referring now to FIG. 2, there is depicted a partial top view of track plate 44 which may be utilized with electronic component test jig 12 of the present invention. As may be seen, electronic component test jig 12 is preferably mounted at the leftmost edge of track plate 44 so that electronic components may be randomly tested during the process whereby chips 20 are handled and loaded into storage tubes or other devices. Track plate 44 preferably included a plurality of tube loader tracks 52 which may be utilized, in a manner taught by the referenced disclosure, to facilitate the loading of a large number of electronic components into handling tubes or other devices.

As is illustrated in FIG. 2, a tester track 50 is also included within track plate 44 such that chips 20 which are vibrated into separator box 42 (see FIG. 1) may be properly oriented and fed by both gravity and vibration means into a proper orientation for testing by electronic component test jig 12. As is illustrated, electronic component test jig 12 is preferably bolted to track plate 44 by means of mounting bolts 54. Of course, those skilled in the art will appreciate that electronic component test jig 12 may also be formed integrally with track plate 44 in an alternate embodiment of the present invention.

Figure 3:
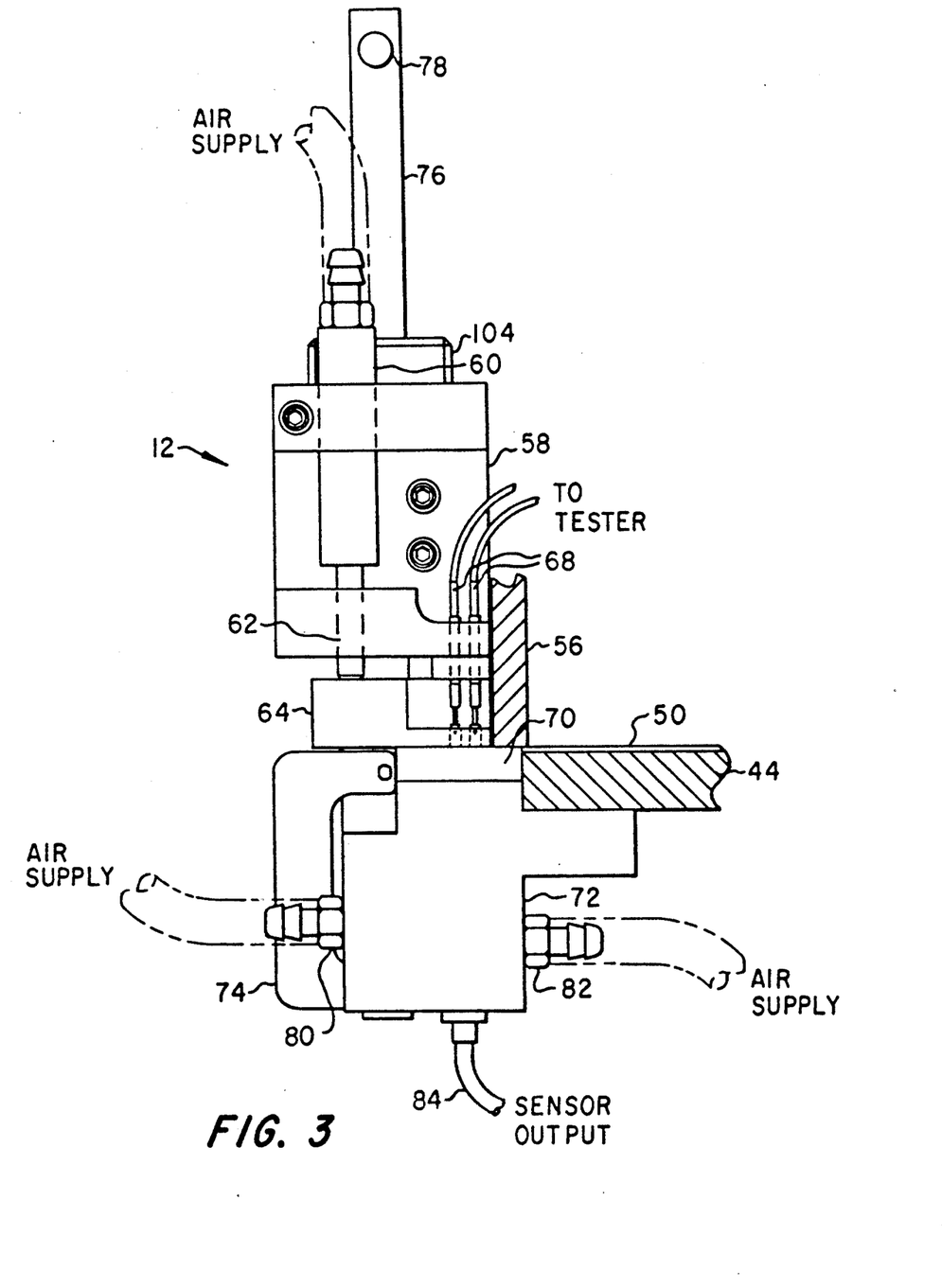
FIG. 3 is a side view of the electronic component test jig of the present invention in the open position.
Figure 4:
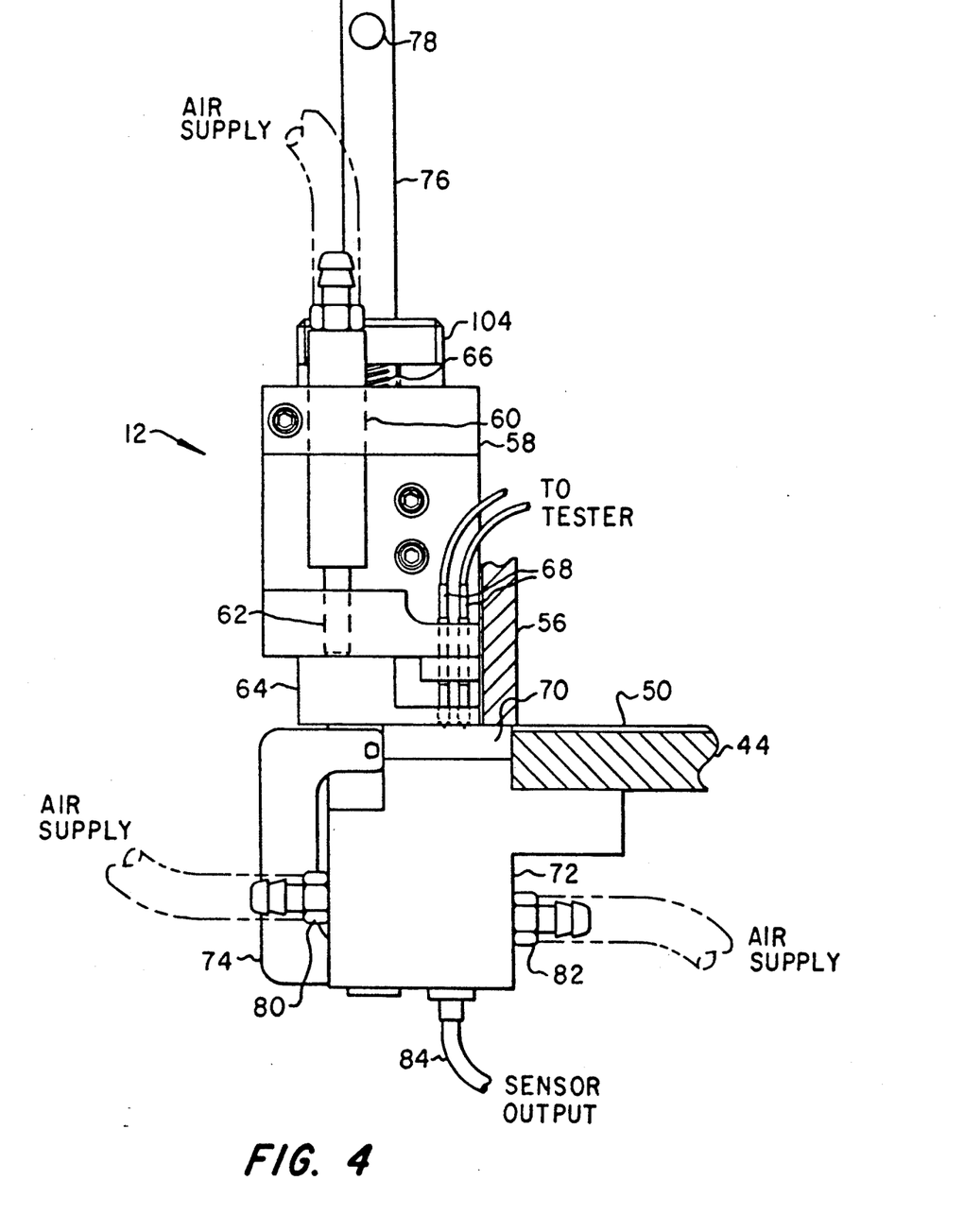
FIG. 4 is a side view of the electronic component test jig of the present invention in the test position.

With reference now to FIGS. 3 and 4 there is illustrated a side view of electronic component test jig 12 of the present invention, in both the open position and test position respectively. As is illustrated, electronic component test jig 12 is mounted in conjunction with track plate 44 such that chips 20, which are properly oriented by means of gravitational and vibrational forces within tester track 50, are applied to electronic component test jig 12. Seal plate 56 acts to ensure that chips 20 within tester track 50 are properly oriented for insertion into test block 70 a consecutive manner one chip at a time.

As may be seen, electronic component test jig 12 includes a movable probe mount 58 which is movable with respect to mounting assembly 104 by means of air pressure, which is supplied to pneumatic cylinder 60. As is illustrated, when a positive air pressure is applied to pneumatic cylinder 60, cylinder rod 62 will extend, impacting against sole plate 64 and urging movable probe mount 58 upward against the mechanical bias provided by spring 66.

In this manner, movable probe mount 58 may be retained in the upward or open position depicted within FIG. 3 until such time as a chip 20 has been detected, in a manner which will be explained in greater detail herein, within test block 70. At that point, the pressure within pneumatic cylinder 60 is removed and the mechanical bias provided by spring 66 urges movable probe mount 58 into the downward position depicted within FIG. 4, causing a pair of spring loaded conductive probes 68 to be urged into contact with a chip 20 within test block 70.

As discussed above, the wires connected to spring loaded conductive probes 68 are then coupled to a suitable electronic component tester 14 (see FIG. 1) for a rapid and accurate determination of whether or not chip 20 within test block 70 falls within design specifications. The lower half of electronic component test jig 12 comprises manifold 72, which is utilized to contain a proximity sensor which may be utilized, in the depicted embodiment of the present invention, to detect the presence of a chip 20 within test block 70. The output of this proximity sensor (not shown) is coupled to suitable control means via sensor output 84.

Also depicted within manifold 72 are a pair of air inlets 80 and 82. As will be explained with regard to FIG. 6, ejection air inlet 80 is utilized to eject a successfully tested chip 20 from test block 70 back into chamber 40 of separator box 42. In a similar manner, anticlog air inlet 82 may be utilized to prevent a plurality of chips 20 from clogging the throat like passage formed by tester track 50 and seal plate 56.

In the depicted embodiment of the present invention, movable probe mount 58 and its mounting assembly 104 may also be moved longitudinally along probe mounting track 76 to permit a chip 20 which does not test successfully to be manually removed from test block 70. A track stop 78 is provided at the upper end of probe mount track 76 to prevent mounting assembly 104 from being removed entirely from probe mounting track 76. In a preferred embodiment of the present invention, mounting assembly 104 is slidably mounted to probe mounting track 76 utilizing precision ball bearings.

Figure 5:
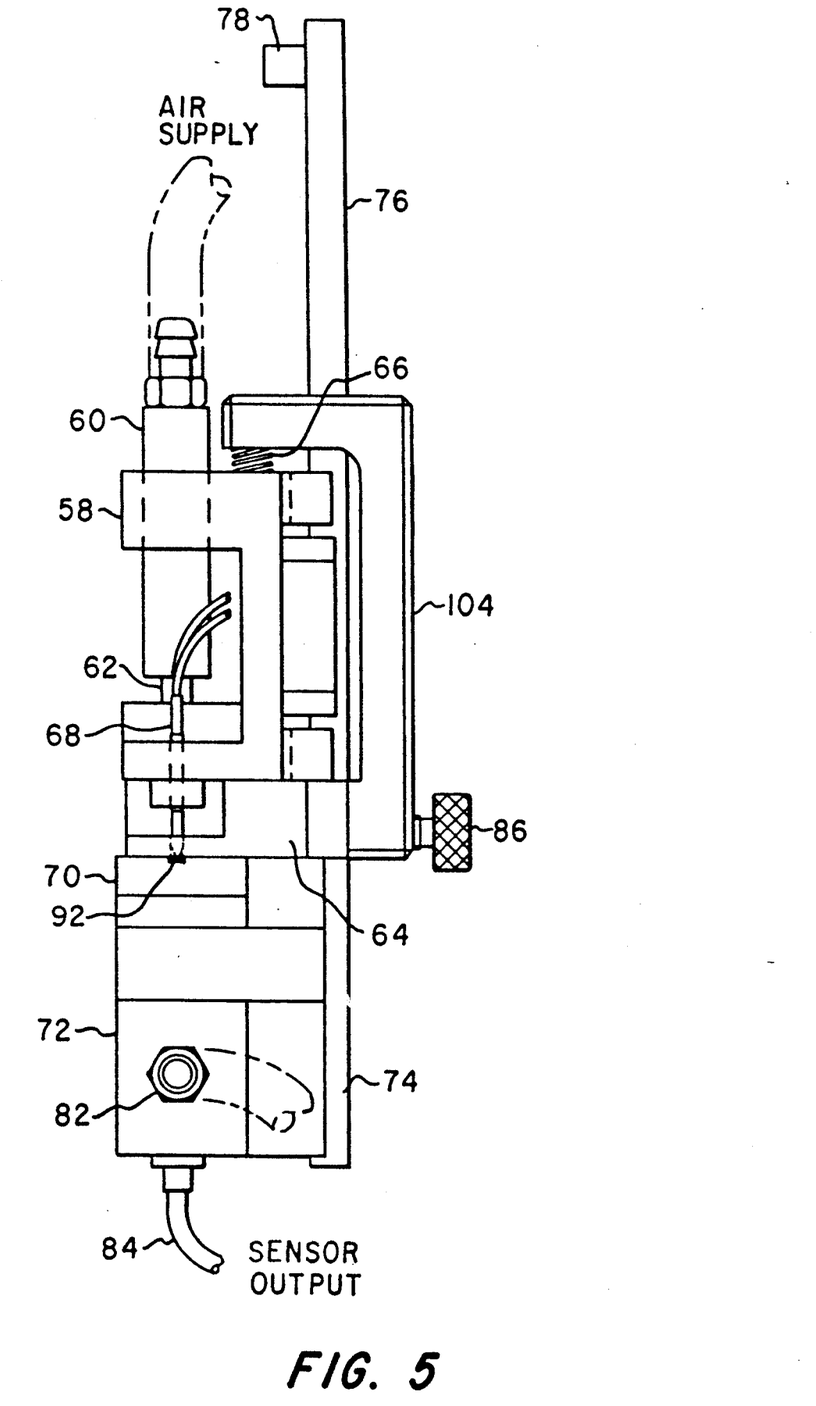
FIG. 5 is a front view of the electronic component test jig of the present invention.

With reference now to FIG. 5 there is depicted a front view of electronic component test jig 12 of the present invention. As is illustrated, test block 70 includes a test block track 92, which aligns with test track 50 of track plate 44 such that properly oriented chips 20 may be urged by gravitational and vibratory forces into a predetermined testing position within test block 70 for automatic testing in accordance with the method of the present invention. As is illustrated, mounting assembly 104 may be fixed to probe mounting track 76 by the utilization of probe mount lock screw 86. Thus, in the event of an unsuccessful test of chip 20, probe mount lock screw 86 may be partially unthreaded, permitting mounting assembly 104 to be raised along probe mounting track 76, to permit removal of chip 20 from test block track 92.

Figure 6:
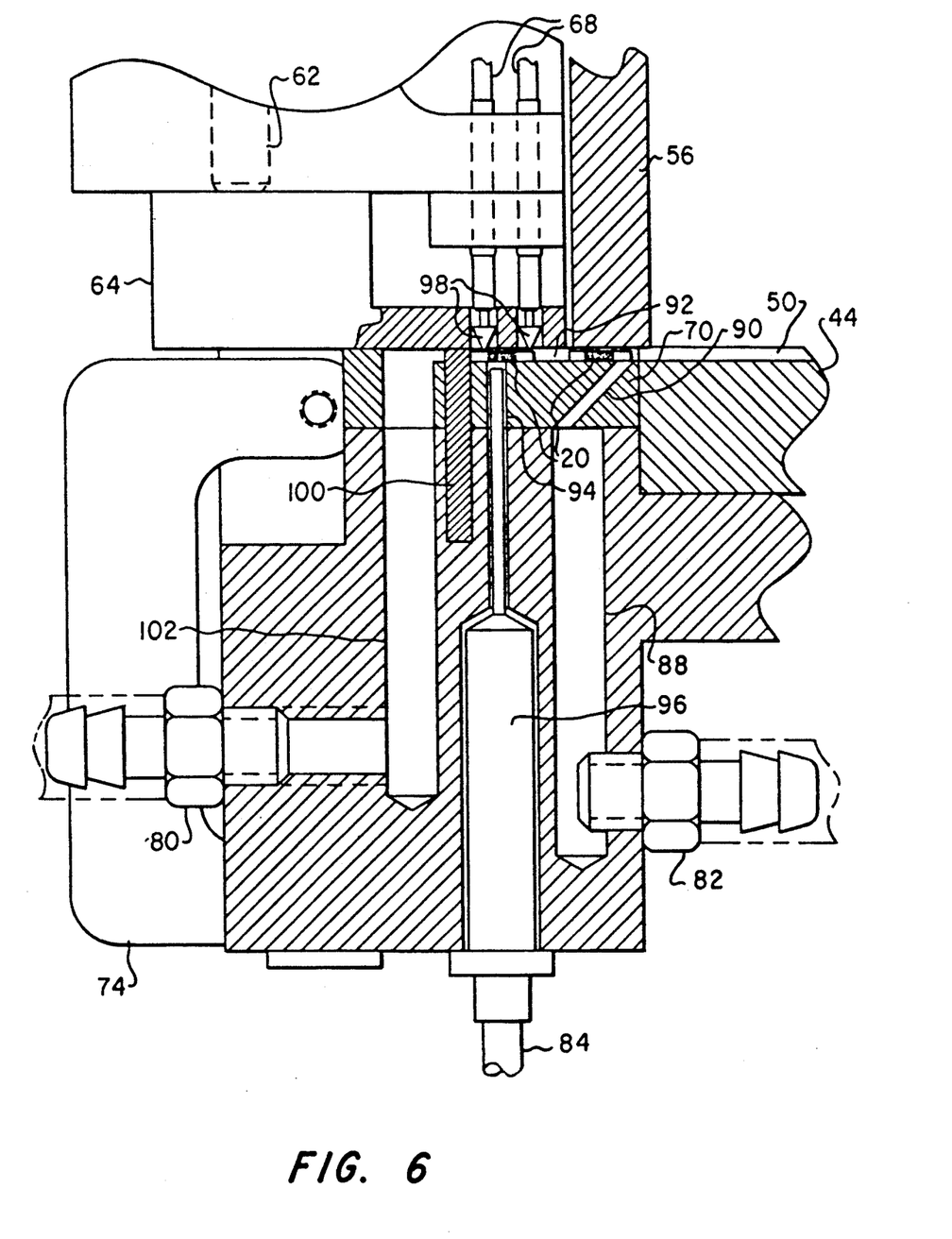
FIG. 6 is a sectional view of a portion of the electronic component test jig of the present invention.

Finally, referring now to FIG. 6 there is depicted a sectional view of a portion of electronic component test jig 12 of the present invention. As is illustrated, test block track 92 of test block 70 is aligned with tester track 50 of track plate 44 such that chips 20 which are properly oriented by vibratory and gravitational forces will enter into test block track 92 in a serial fashion, as limited by seal plate 56. As is illustrated, seal plate 56 and test block track 92 serve to form an elongate throat like passage therein. As may be seen, anticlog air inlet 82 is coupled to air passage 88, which is further coupled to angled anticlog aperture 90. It has been discovered that the application of a pulsating air supply at a frequency of approximately eight hertz and a pressure of ten pounds per square inch may be utilized to prevent a plurality of chips 20 from clogging the throat like passage formed between seal plate 56 and test block track 92. Of course, those skilled in the art will appreciate that the optimum frequency at which the air supply coupled to anticlog air inlet 82 pulses will depend upon the angle at which track plate 44 is inclined and the weight of each individual chip 20; however, this frequency and pressure may be determined without undue experimentation such that maximum throughput is permitted without clogging.

After a sufficient number of chips 20 have been positioned within test block track 92, one chip 20 will overlie sensor aperture 94. At this point, a reflective sensor 96 may be utilized to generate a signal indicating the presence of a chip 20 at the predetermined testing position. The output of reflective sensor 96 is then coupled, via sensor output 84, to appropriate control circuitry which is utilized to remove the air pressure coupled to pneumatic cylinder 60 (see FIGS. 4 and 5) such that cylinder rod 62 will retract. Thereafter, the mechanical bias provided by spring 66 will urge spring loaded conductive probes 68 downward, causing chisel points 98 to be urged into electrical contact with the leads of chip 20. By constructing test block 70 of ceramic materials or other suitable non-conductive materials it is a simple matter to electrically isolate chip 20 during this testing procedure.

At this point, the outputs of spring loaded probes 68 are then coupled to electronic component tester 14 (see FIG. 1). In the event that electronic component tester 14 indicates that chip 20 falls within design specifications for the particular component under test a pneumatic pressure is applied to ejection air inlet 80 and coupled via air passage 102 into the predetermined test position within test block 70. Air of a suitable pressure within air passage 102 is communicated around cylindrical stop pin 100 and will thereafter cause the ejection all oriented chips 20 within test block track 92 and test track 50. Chips 20 thus ejected will be forced back up track plate 44 into separator box 42. In this manner, a succession of chips 20 may be randomly selected from the agitated and randomly oriented group of chips within separator box 42 and urged by vibratory and gravitational forces into the predetermined test position within test block track 92, against cylindrical stop pin 100. After each successful test of a chip 20 pneumatic pressure is utilized to eject all oriented chips 20 back into separator box 42 so that another chip may be randomly urged into the test position.

In the event that chip 20 does not meet design specifications, as determined by electronic component tester 14, the depicted embodiment of the present invention will cause movable probe mount 58 to be raised and lowered a plurality of times to retest chip 20 to ensure that proper electrical contact has been made. If, after a predetermined number of retests have occurred, chip 20 still does not meet design specifications, as determined by electronic component tester 14, then an alarm will sound and the operator of electronic component testing system 10 will be required to unthreaded probe mount lock screw 86 (see FIG. 5) and raise mounting assembly 104 so that chip 20 may be manually removed.

Those skilled in the art, upon reference to the foregoing specification, will appreciate that the Applicants in the present application have provided a means whereby individual surface mount passive electronic components may be randomly selected from among thousands of such components and automatically tested to determine whether or not the component meets design specifications. If so, the chip is ejected back into the bulk of electronic chips contained within separator box 42 and the process is repeated. In this manner, the quality assurance of a complex electronic device being constructed utilizing a plurality of chips 20 may be assured by randomly selecting and automatically testing a small percentage of the chips being utilized in that device.

While the invention has been particularly shown and described with reference to a preferred embodiment, it will be understood by those skilled in the art that various changes in form and detail may be made therein without departing from the spirit and scope of the invention.

What is claimed is:

1. A chip testing apparatus for randomly selecting and automatically testing surface mount passive electronic components, said chip testing apparatus comprising:
   hopper means for containing a plurality of randomly oriented surface mount passive electronic components;
   queuing means for urging randomly selected surface mount passive electronic components into a uniform orientation;
   chip detection means for detecting the presence of a uniformly oriented surface mount passive electronic component at a predetermined testing position;
   testing means, coupled to said chip detection means, for automatically testing said uniformly oriented surface mount passive electronic component in response to the detection thereof at said predetermined testing position; and
   ejection means for ejecting said uniformly oriented surface mount passive electronic components into said hopper means in response to a successful test.

2. The chip testing apparatus according to claim 1 wherein said queuing means includes a track plate having at least one groove therein for maintaining said surface mount passive electronic components in a uniform orientation.

3. The chip testing apparatus according to claim 2 wherein said queuing means further includes a seal plate mounted above said track plate forming an elongate throat passage with said at least one groove.

4. The chip testing apparatus according to claim 3 wherein said queuing means further includes pneumatic means for periodically clearing surface mount passive electronic components from said elongate throat passage.

5. The chip testing apparatus according to claim 4 wherein said pneumatic means comprises a pulsating air supply.

6. The chip testing apparatus according to claim 2 wherein said track plate is inclined such that gravity will aid in urging said surface mount passive electronic components into said at least one groove.

7. The chip testing apparatus according to claim 6 further including vibrator means coupled to said track plate for vibrating said surface mount passive electronic components into said at least one groove.

8. The chip testing apparatus according to claim 1 wherein said predetermined testing position includes an aperture therein and wherein said chip detection means comprises a reflective sensor disposed adjacent to said aperture for generating a presence signal in response to the presence of a uniformly oriented surface mount passive electronic component at said aperture.

9. The chip testing apparatus according to claim 8 wherein said testing means comprises a plurality of conductive probes and means for urging said plurality of conductive probes into temporary contact with said uniformly oriented surface mount passive electronic component in response to said presence signal.

10. The chip testing apparatus according to claim 1 wherein said ejection means comprises a pneumatic means for ejecting said uniformly oriented surface mount passive electronic component from said predetermined testing position in response to a successful test thereof.

11. The chip testing apparatus according to claim 1 further including control means for retaining said uniformly oriented surface mount passive electronic component at said predetermined testing position in response to an unsuccessful test thereof.

12. The chip testing apparatus according to claim 1 wherein said predetermined testing position comprises a nonconductive block having at least one groove disposed therein.

13. The chip testing apparatus according to claim 11 wherein said nonconductive block comprises a block of ceramic material.

14. A method for randomly selecting and automatically testing surface mount passive electronic components, said method comprising the steps of:
   containing a plurality of surface mount passive electronic components in random orientation;
   agitating randomly selected surface mount passive electronic components into a uniform orientation;
   detecting the presence of a uniformly oriented surface mount passive electronic component at a predetermined testing position;
   testing said uniformly oriented surface mount passive electronic component in response to said detection thereof; and
   ejecting said uniformly oriented surface mount passive electronic components into said plurality of surface mounted passive electronic components in random orientation in response to a successful test.

15. The method of randomly selecting and automatically testing surface mount passive electronic components according to claim 14 further including the step of vibrating said uniformly oriented surface mount passive electronic components toward said predetermined testing position.

16. The method of randomly selecting and automatically testing surface mount passive electronic components according to claim 14 wherein said agitating step further includes the step of periodically urging said uniformly oriented surface mount passive electronic components away from said predetermined testing position.

* * * * *